United States Patent
Fallisgaard et al.

(10) Patent No.: US 6,954,113 B2
(45) Date of Patent: *Oct. 11, 2005

(54) PROGRAMMABLE OSCILLATOR CIRCUIT

(75) Inventors: John W. Fallisgaard, Seattle, WA (US); Eugene S. Trefethan, Fort Myers, FL (US)

(73) Assignees: Fox Electronics, Inc., Fort Myers, FL (US); Jet City Electronics, Seattle, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/367,766

(22) Filed: Feb. 19, 2003

(65) Prior Publication Data

US 2003/0122630 A1 Jul. 3, 2003

Related U.S. Application Data

(63) Continuation of application No. 09/754,192, filed on Jan. 5, 2001, now Pat. No. 6,664,860, which is a continuation of application No. 09/303,578, filed on May 3, 1999, now Pat. No. 6,188,290, which is a continuation of application No. 08/795,978, filed on Feb. 5, 1997, now Pat. No. 5,952,890.

(51) Int. Cl.[7] .................................. H03B 5/32
(52) U.S. Cl. .................... 331/158; 331/18; 331/16; 331/179
(58) Field of Search .................... 331/18, 158, 179, 331/16, 36 C, 34, 177 V, 1 A

(56) References Cited

U.S. PATENT DOCUMENTS

| 2,964,714 A | 12/1960 | Jakubowics .................. 331/2 |
| 3,644,683 A | 2/1972 | Braun ........................ 360/13 |
| 3,842,347 A | 10/1974 | Terbrack .................. 324/76.61 |
| 3,916,307 A | 10/1975 | Hekimian ................. 324/76.77 |
| 4,020,425 A | 4/1977 | Hoffmann et al. ............ 331/16 |
| 4,093,873 A | 6/1978 | Vannier et al. ............. 377/50 |
| 4,211,975 A | 7/1980 | Kuroda ..................... 455/75 |
| 4,320,357 A | 3/1982 | Wulfsberg et al. .......... 331/16 |
| 4,343,219 A | 8/1982 | Urtrecht .................... 84/672 |
| 4,454,483 A | 6/1984 | Baylor ..................... 331/11 |

(Continued)

FOREIGN PATENT DOCUMENTS

| EP | 0 053 561 A2 | 6/1982 |
| EP | 0 203 756 | 12/1986 |
| EP | 0 437 634 A1 | 7/1991 |
| EP | 0 637 876 | 2/1995 |
| GB | 1335142 | 10/1973 |

(Continued)

OTHER PUBLICATIONS

D. Soderquist, "Digitally programmed oscillator is suitable for μP control", *Electronic Design* 13, Jun. 21, 1997, pp. 103–104.

(Continued)

Primary Examiner—Arnold Kinkead
(74) Attorney, Agent, or Firm—Finnegan, Henderson, Farabow, Garrett & Dunner LLP

(57) ABSTRACT

A programmable crystal oscillator is provided having a memory for storing frequency-defining parameters. Typically, one of these parameters is used to program an adjustable capacitive load circuit coupled to a crystal to thereby adjust the crystal source frequency. Additional parameters are used to program the output frequency of a phase locked loop circuit coupled to receive the adjusted source frequency. A further parameter can also be used to divide the output frequency of the phase locked loop circuit to supply a specified output frequency. The oscillators can be manufactured as generic programmable crystal oscillators without regard for output frequency and then quickly programmed to produce customer-specified output frequencies with a high degree of accuracy.

14 Claims, 4 Drawing Sheets

U.S. PATENT DOCUMENTS

| | | |
|---|---|---|
| 4,459,566 A | 7/1984 | Lane .......................... 331/135 |
| 4,468,636 A | 8/1984 | Monticelli ............. 331/113 R |
| 4,486,846 A | 12/1984 | McCallister et al. ........... 708/8 |
| 4,567,359 A | 1/1986 | Lockwood .................. 235/381 |
| 4,590,941 A | 5/1986 | Saulson et al. ............... 607/34 |
| 4,689,581 A | 8/1987 | Talbot ........................ 331/1 A |
| 4,689,740 A | 8/1987 | Moelands et al. .......... 713/600 |
| 4,694,327 A | 9/1987 | Demmer et al. ............ 348/508 |
| 4,807,108 A | 2/1989 | Ben-Arieh et al. ........... 700/28 |
| 4,816,700 A | 3/1989 | Imel .......................... 327/154 |
| 4,835,491 A | 5/1989 | Coster ........................... 331/2 |
| 4,870,591 A | 9/1989 | Cicciarelli et al. .......... 700/107 |
| 4,882,549 A | 11/1989 | Galani et al. ................. 331/14 |
| 4,899,117 A | 2/1990 | Vig ................................ 331/3 |
| 4,980,653 A | 12/1990 | Shepherd ..................... 331/16 |
| 4,984,155 A | 1/1991 | Geier et al. .................... 705/26 |
| 5,036,216 A | 7/1991 | Hohmann et al. .......... 327/157 |
| 5,036,230 A | 7/1991 | Bazes ......................... 327/107 |
| 5,053,723 A | 10/1991 | Schemmel .................. 331/14 |
| 5,063,358 A | 11/1991 | Vale et al. ..................... 331/60 |
| 5,065,450 A | 11/1991 | Wu et al. ...................... 455/20 |
| 5,099,422 A | 3/1992 | Foresman et al. ............. 705/1 |
| 5,117,206 A | 5/1992 | Imamura .................... 331/158 |
| 5,136,180 A | 8/1992 | Caviasca et al. ............ 327/115 |
| 5,142,247 A | 8/1992 | Lada, Jr. et al. .............. 331/14 |
| 5,144,254 A | 9/1992 | Wilke ......................... 327/107 |
| 5,150,079 A | 9/1992 | Williams et al. ............. 331/75 |
| 5,177,771 A | 1/1993 | Glassburn ................... 377/39 |
| 5,182,528 A | 1/1993 | Zuta |
| 5,216,595 A | 6/1993 | Protheroe .................... 463/42 |
| 5,233,314 A | 8/1993 | McDermott et al. ......... 331/17 |
| 5,237,699 A | 8/1993 | Little et al. ................... 714/23 |
| 5,256,994 A | 10/1993 | Langendorf ................. 331/16 |
| 5,262,735 A | 11/1993 | Hashimoto et al. .......... 331/45 |
| 5,289,138 A | 2/1994 | Wang .......................... 331/49 |
| 5,295,079 A | 3/1994 | Wong et al. ................ 714/715 |
| 5,302,920 A | 4/1994 | Bitting ........................ 331/45 |
| 5,307,381 A | 4/1994 | Ahuja ........................ 375/356 |
| 5,319,324 A | 6/1994 | Satoh et al. ................ 331/158 |
| 5,323,125 A | 6/1994 | Hiben et al. ................ 332/100 |
| 5,336,939 A | 8/1994 | Eitrheim et al. ............ 327/291 |
| 5,349,544 A | 9/1994 | Wright et al. .................. 708/1 |
| 5,357,204 A | 10/1994 | Knoll ......................... 327/259 |
| 5,359,232 A | 10/1994 | Eitrheim et al. ............ 327/116 |
| 5,369,311 A | 11/1994 | Wang et al. ................ 327/292 |
| 5,371,772 A | 12/1994 | Al-Khairi ..................... 377/47 |
| 5,389,826 A | 2/1995 | Sonobe ....................... 327/172 |
| 5,398,262 A | 3/1995 | Ahuja ......................... 210/719 |
| 5,412,349 A | 5/1995 | Young et al. .................. 331/34 |
| 5,444,405 A | 8/1995 | Truong et al. .............. 327/239 |
| 5,446,420 A | 8/1995 | Westwick ................... 331/179 |
| 5,446,867 A | 8/1995 | Young et al. ............... 713/503 |
| 5,451,912 A | 9/1995 | Torode .................. 331/108 C |
| 5,457,433 A | 10/1995 | Westwick ............ 331/116 FE |
| 5,465,076 A | 11/1995 | Yamauchi et al. .......... 331/179 |
| 5,467,373 A | 11/1995 | Ketterling .............. 332/128 X |
| 5,481,697 A | 1/1996 | Mathews et al. ........... 713/501 |
| 5,497,126 A | 3/1996 | Kosiec et al. ................ 331/1 A |
| 5,523,705 A | 6/1996 | Steele ......................... 326/39 |
| 5,532,636 A | 7/1996 | Mar et al. ................... 327/543 |
| 5,535,377 A | 7/1996 | Parks ......................... 713/400 |
| 5,537,068 A | 7/1996 | Konno ....................... 327/115 |
| 5,537,582 A | 7/1996 | Draeger ..................... 713/401 |
| 5,546,563 A | 8/1996 | Chuang ........................ 703/27 |
| 5,548,252 A | 8/1996 | Watanabe et al. ........... 331/176 |
| 5,550,499 A | 8/1996 | Eitrheim .................... 327/105 |
| 5,552,993 A | 9/1996 | Buchwitz et al. ........... 707/213 |
| 5,555,025 A | 9/1996 | McArthur .................. 348/478 |
| 5,559,502 A | 9/1996 | Schutte ................. 340/825.21 |
| 5,563,553 A | 10/1996 | Jackson ....................... 331/57 |
| 5,563,554 A | 10/1996 | Mizuno ....................... 331/57 |
| 5,570,066 A | 10/1996 | Eberhardt et al. ............ 331/34 |
| 5,579,231 A | 11/1996 | Sudou et al. ................. 700/95 |
| 5,630,148 A | 5/1997 | Norris ........................ 713/322 |
| 5,636,346 A | 6/1997 | Saxe ............................ 705/1 |
| 5,638,016 A | 6/1997 | Eitrheim ..................... 327/175 |
| 5,638,542 A | 6/1997 | Nikjou ....................... 713/323 |
| 5,668,506 A | 9/1997 | Watanabe et al. ............. 331/66 |
| 5,684,418 A | 11/1997 | Yanagiuchi ................... 327/99 |
| 5,684,434 A | 11/1997 | Mann et al. .................. 331/16 |
| 5,687,202 A | 11/1997 | Eitrheim ..................... 375/376 |
| 5,689,196 A | 11/1997 | Schutte ........................ 326/86 |
| 5,696,949 A | 12/1997 | Young ........................ 713/400 |
| 5,699,259 A | 12/1997 | Colman et al. ............... 700/99 |
| 5,706,484 A | 1/1998 | Mozdzen et al. ........... 713/400 |
| 5,719,510 A | 2/1998 | Weidner ..................... 327/119 |
| 5,729,158 A | 3/1998 | Rajivan et al. ............... 326/87 |
| 5,760,656 A | 6/1998 | Sutliff et al. ............ 331/116 R |
| 5,818,254 A | 10/1998 | Agrawal et al. .............. 326/39 |
| 5,877,656 A | 3/1999 | Mann et al. .................. 331/16 |
| 5,940,457 A | 8/1999 | Dreifuss et al. ............ 375/376 |
| 5,952,890 A * | 9/1999 | Fallisgaard et al. ........... 331/18 |
| 5,960,405 A | 9/1999 | Trefethen et al. .............. 705/9 |
| 6,104,257 A | 8/2000 | Mann ......................... 331/158 |
| 6,188,255 B1 | 2/2001 | Mann ......................... 327/113 |
| 6,188,290 B1 * | 2/2001 | Fallisgaard et al. ........... 331/18 |
| 6,191,660 B1 | 2/2001 | Mar et al. ................... 331/111 |
| 6,236,980 B1 | 5/2001 | Reese ......................... 705/36 |
| 6,285,264 B1 | 9/2001 | Mann ......................... 331/158 |
| 6,388,478 B1 | 5/2002 | Mann ......................... 327/113 |
| 6,664,860 B2 * | 12/2003 | Fallisgaard et al. ........... 331/18 |

FOREIGN PATENT DOCUMENTS

| | | |
|---|---|---|
| GB | 2 282 500 A | 4/1995 |
| JP | 2-291161 A | 11/1990 |
| JP | 3-297223 | 12/1991 |
| WO | WO 89/06456 | 7/1989 |
| WO | WO 96/17305 | 6/1996 |
| WO | WO 98/34376 | 8/1998 |
| WO | WO 99/09712 | 2/1999 |

OTHER PUBLICATIONS

A. Foord, "Voltage controlled oscillator," *Radio and Electronics Constructor*, vol. 28, No. 10, pp. 590–595, May 1975.

T. G. Giles, "A universal frequency synthesizer IC," *Phillips Telecommunication Review*, vol. 37, No. 3, Aug. 1979, pp. 177–181.

W. Ooms, Improved Frequency Synthesizer, *Motorola Technical Disclosure Bulletin*, vol. 6, No. 1, pp. 4–6, Oct. 1, 1966, Schaumbourg, Illinois, USA.

E. Mielke, Programmierbarer 50 MHz–Muttertaktimpulsegenerator,: *Radio Fernsehen Elektronik*, vol. 39, No. 9, pp. 560–563, Jan. 1, 1990, Berlin, Germany.

IC Designs, "Satellite Oscillator," Model No. ICD2031A, May 1991.

IC Designs, "Programmable Clock Oscillator," Model No. ICD2053A.

IC Designs, "Frequency Multiplier," Model No. ICD2032, May 1991.

"ICD6233 Characterization Data," 1994.

IC Designs, "Dual Programmable Clock Oscillator," Model No. ICD2051, May 1991.

IC Designs, "Dual Programmable Graphics Clock Generator," Model No. ICD2061A.

MF Electronics Corp., "Phase Locked VCXO 10 MHz to 32.768 MHz," 1994.

MF Electronics Corp., "20 to 200 MHz Programmable ECL," 1994.
M–Tron, "MV Series VCXO Oscillators," 1994.
M–Tron, "MV Series VCXO Oscillators," 1995.
Vectron Labs., "Sonet Clock Recovery Module SCRM–622," Nov. 94.
Connor–Winfield Corp., "SM PECL PLL Frequency Multiplier," 1995.
Epson, "Programmable Multi–Output Crystal Oscillator MG–5010," Mar. 7, 1993.
M–Tron, "MT1135 Series Dual Baud Rate Generators," 1987.
Hybrids International, Ltd., "Voltage Controlled Crystal Oscillators," pp. VCX–1 to VCX–3, 1995.
National Semiconductor, "IMX2306/2316/2326 PLLatinum Low Power Frequency Synthesizer for RF Personal Communications," Jan. 1998.
Hybrids International, Ltd., "Frequency Products," Sep. 23, 1994.
MF Electronics Corp., "Voltage Controlled Oscillators 1 MHz to 175 MHz," 1994.
Hybrids International, Ltd., "Product Summary," Aug. 1993.
Hybrids International, Ltd., "Crystal Oscillators: Voltage Controlled," pp. VC–1 to VC–3, Mar. 1993.
Cypress Semiconductor Corporation, "One–Time Programmable Clock Oscillator ICD6233," Apr. 1995.
Fox Electronics, "F3000/HCMOS/TTL Tri–State Enable/Disable Oscillator," 1992.
Fox Electronics, "F6053A/Tri–State HCMOS Programmable Clock Oscillator," 1993.
Fox Electronics, "F6151/Tri–State Dual Programmable Clock Oscillator," 1993.
Fox Electronics, "Programmable Crystal Oscillators for R.F. Applications," 1993.
Fox Electronics, Frequency Control Products Catalog. 1995–96.
Cypress Semiconductor Corporation Datasheet for CY2071A, "Low–Cost Single PLL Clock Generator," Jul. 1996, revised Jul. 7, 1997.
"Verification Test Vectors" for OSC–40 System, pp. 1–5 (undated).
John Mahabadi, "A Cell Based Super Low Power CMOS Crystal Oscillator with "On Chip"Tuning Capacitors," *IEEE* 1991, pp. P5–1.1–P5.1.4.
Anatoly V. Kosykh et al., "Dual–Mode Crystal Oscillators With Resonators Excited on B and C Modes," 1994 IEEE International Frequency Control Symposium, pp. 578–586.
Paul T. Holler et al, "A Digital CMOS Programmable Clock Generator," IEEE 1994, pp. 280–287.
David Morrison, "Field–Programmable Crystal Oscillator Beats the Clock on Delivery," Electronic Design, May 29, 2000.
Richard S. Miller et al., "Improve Clock Synthesis in Laptops With a Frequency Generator," Electronic Design, v. 39, n. 17, p. 111, Sep. 12, 1991.
Allan Richter, "Competition Building in Market VCXOs," Electronics Buyers' News, n. 804, 1992.
Ann Steffora, "HP Sets Parts Distrib Plan: Global Distributors Support OEM Outsourcing Trend," Electronic News, 1991.
Dave Webb, "Cypress Clocks In," Electronic Buyers' News, n. 873, 1993.
Tom Ormond, "Crystal Oscillators Provide Precision in High–Speed Systems," EDN–Technology Update, v. 37, n. 10, p. 89, May 7, 1992.
Bob Achille et al., "Manufacturing Hybrid TCXOS," 1993 IEEE International Frequency Control Symposium, p. 679–686.

* cited by examiner

PROGRAMMABLE OSCILLATOR CIRCUIT

This is a continuation of application Ser. No. 09/754,192 filed Jan. 5, 2001, now U.S. Pat. No. 6,664,860, which is a continuation of Ser. No. 09/303,578, filed May 3, 1999, now U.S. Pat. No. 6,188,290, which is a continuation of Ser. No. 08/795,978, filed Feb. 5, 1997, now U.S. Pat. No. 5,952,890, all of which are incorporated herein by reference.

BACKGROUND OF THE INVENTION

The present invention relates to programmable crystal oscillators. In particular, the present invention is directed toward a programmable crystal oscillator having an adjustable capacitive load circuit coupled to the crystal.

Crystal oscillators are widely used to generate timing signals for electronic hardware, such as computers, instrumentation, and telecommunications equipment. Crystal oscillators typically include a quartz crystal and an oscillator circuit, which electrically excites the crystal so as to generate an oscillating signal at a resonant frequency determined by physical characteristics of the crystal. The oscillator circuit or a separate output circuit (buffer) waveshapes the oscillating signal into a timing pulse train acceptable to the electronic hardware.

Timing frequencies are specified by the electronic hardware manufacturers and thus vary over a wide frequency range. However, a crystal's resonant frequency is determined by its physical characteristics, e.g., size, shape, crystalline structure, etc. Trimming the crystal's resonant frequency can be achieved by selective metal plating the crystal faces. Consequently, the manufacture of crystal oscillators is an involved process th(at is both time consuming and costly. Thus, suppliers of crystal oscillators stock large numbers of crystal oscillators manufactured to a variety of standard output frequencies. However, if a customer requires a custom frequency, a manufacturer generally must "start from scratch" by dicing an ingot into crystal wafers of specific dimensions and then subjecting the crystal wafers to numerous processing steps (lapping, etching, and plating), all designed to achieve the custom output frequency. Custom crystal oscillators come at premium prices and require long manufacturing leadtimes (months).

Since virtually all crystals are capable of oscillating, manufacturing yield is quite high. However, if the crystal's resonant frequency cannot be trimmed to meet one customer's frequency specification, the crystals are typically inventoried in the hope that they can be used to meet another customer's frequency specification. In the case of custom crystal oscillators, it is not uncommon for manufacturers to produce an oversupply of custom crystals to ensure a sufficient volume of crystals capable of meeting customer requirements in terms of both output frequency and quantity. The excess crystal oscillators are then placed in inventory. Maintaining large crystal inventories represents a significant manufacturing expense.

SUMMARY OF THE INVENTION

Systems and methods consistent with this invention resolve certain disadvantages of conventional approaches by providing a timing circuit comprising a crystal for generating a source frequency, an oscillator circuit coupled to the crystal, and a programmable load circuit coupled to the crystal. A frequency multiplier circuit is coupled to the oscillator circuit to receive the adjusted source frequency. Further, a programming circuit is included to supply first programming data to the programmable load circuit to adjust the crystal source frequency and second programming data to the frequency multiplier circuit. The frequency multiplier circuit, in turn, supplies an output frequency equal to a product of the adjusted source frequency and a multiplication factor designated by the second programming data.

Advantages of the invention will be set forth in part in the description which follows, and in part will be obvious from the description, or may be learned by practice of the invention. Additionally, advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DETAILED DESCRIPTION

Reference will now be made in detail to the presently preferred embodiment of the invention, an example of which is illustrated in the accompanying drawings. Wherever possible, the same reference numbers will be used throughout the drawings to refer to the same or like parts.

Consistent with the present invention, a programmable crystal oscillator is provided with a memory for storing output frequency-defining parameters. Typically, one of these parameters is used to program an adjustable capacitive load circuit coupled to the crystal, thereby to adjust the source (resonant) frequency of the crystal. Additional parameters are used to program the output frequency of a phase-locked loop circuit coupled to receive the adjusted source frequency. A further parameter can also be used to divide the frequency output of the phase-locked loop circuit to thereby supply the desired output frequency. As a result, by storing appropriate parameters as program data in the memory and programming in accordance with these parameters, nearly any crystal capable of oscillation may be utilized in a crystal oscillator in accordance with the present invention, which can then be programmed to generate a wide range of specified output frequencies. Moreover, such frequency programming can be performed expeditiously and at little expense.

Figure 1:
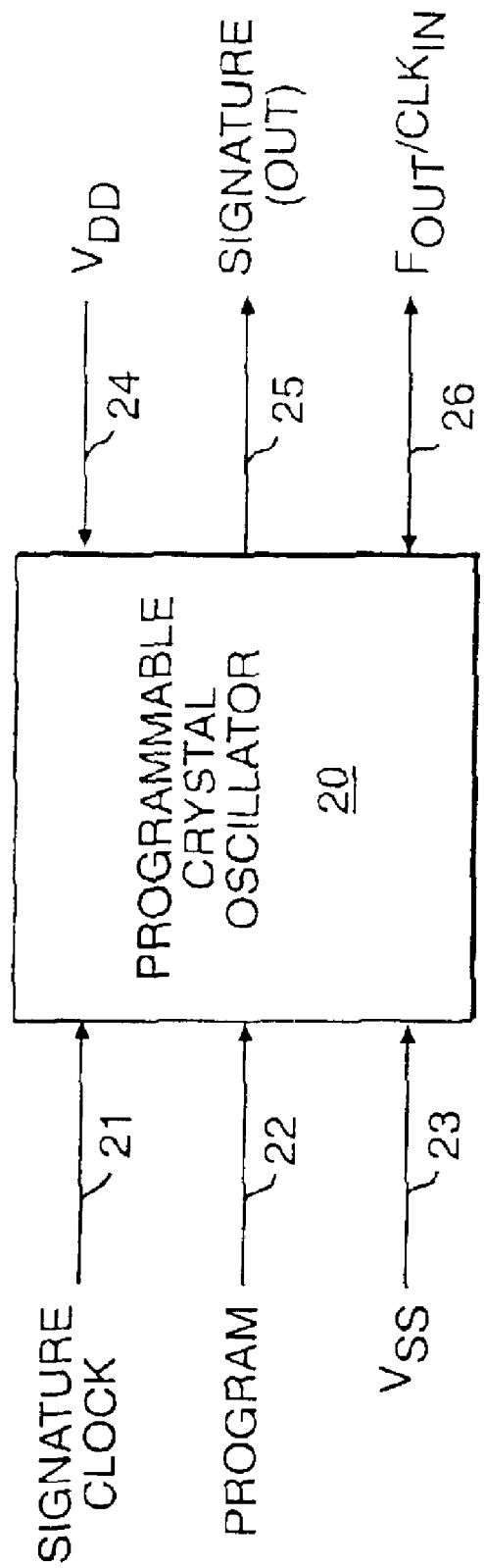
FIG. 1 is a plan view illustrating an exemplary package configuration for a programmable crystal oscillator package in accordance with an embodiment of the present invention.

An embodiment of a programmable crystal oscillator, in accordance with the present invention, is illustrated in FIG. 1. This oscillator 20 may be produced in a variety of industry standard sizes and in two basic package configurations, pin through and surface mounted (SMD), depending upon the manner in which the oscillator is to be mounted in its particular application. The illustrated embodiment has six input/output (I/O) terminals, consisting of a Signature clock terminal 21, a dedicated Program input terminal 22, a ground (VSS) terminal 23, a supply voltage (VDD) terminal 24, a Signature output terminal 25, and a clock signal output ($F_{out}$)/programming clock pulse input ($CLK_{in}$) terminal 26. As will be described in detail below, programming data is entered via terminal 22 at a timing controlled by clock pulses ($CLK_{in}$) applied to terminal 26.

When programmable crystal oscillator 20 is programmed by the programming data, it produces a clock signal output ($F_{out}$) on terminal 26 of a programmed frequency conforming to a customer specified target frequency anywhere within a wide range, e.g., 380 KHz to 175 MHz, with an accuracy of ±100 ppm (parts per million) or better. In terms of percentage, 100 ppm is equal to ±0.01% of the target frequency. In accordance with a feature of the present invention, crystal oscillator 20 includes a programmable read only memory (PROM) 50, (FIG. 2), into which programming data in the form of customer data may be entered via Program terminal 22, under timing control imposed by clock pulses ($CLK_{in}$) applied to terminal 26 by the manufacturer at the time the oscillator is programmed. Thereafter, the customer data may be read out on terminal 25 by applying clock pulses to terminal 21. If this Signature data feature is omitted, the crystal oscillator package configuration illustrated in FIG. 1 may be reduced to four terminals.

Figure 2:
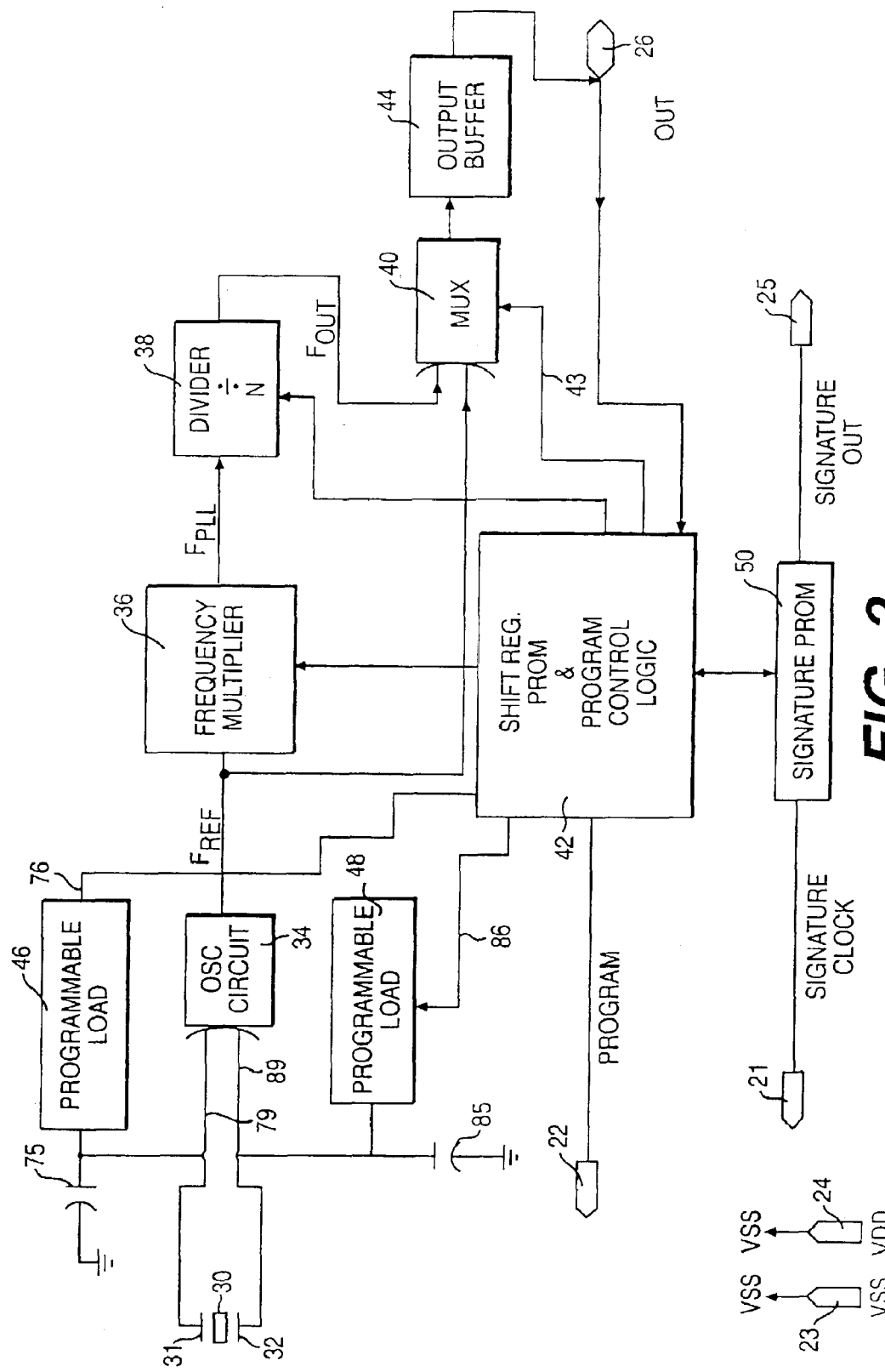
FIG. 2 is a block diagram of a programmable crystal oscillator in accordance with an embodiment of the present invention.

Programmable crystal oscillator 20, illustrated in greater detail by the block diagram of FIG. 2, includes a crystal blank 30 electrically connected between pads 31 and 32 on an integrated circuit chip for excitation by an oscillator circuit 34 and thus to generate a source oscillating signal. This oscillator circuit includes an arrangement of resistor, capacitor, and inverter components well known in the crystal oscillator art and, thus, need not be described here. The frequency of the source oscillating signal, appearing at the output of oscillator circuit 34 as a reference frequency signal $F_{ref}$, is largely determined by the physical characteristics of the crystal wafer.

In accordance with a feature of the present invention, programmable crystal oscillator 20 accommodates a wide range of source frequencies, e.g., 5.6396 MHz to 27.3010 MHz. That is, the source frequency may vary from crystal to crystal within this range without jeopardizing the ability of crystal oscillator 20 to be programmed to output clock signals at any target frequency specified by a customer within, for example, a 380 KHz–175 MHz range, with the industry standard accuracy of at least 100 ppm. In fact, the diverse crystal source frequencies need not be known in advance of programming.

Figure 4:
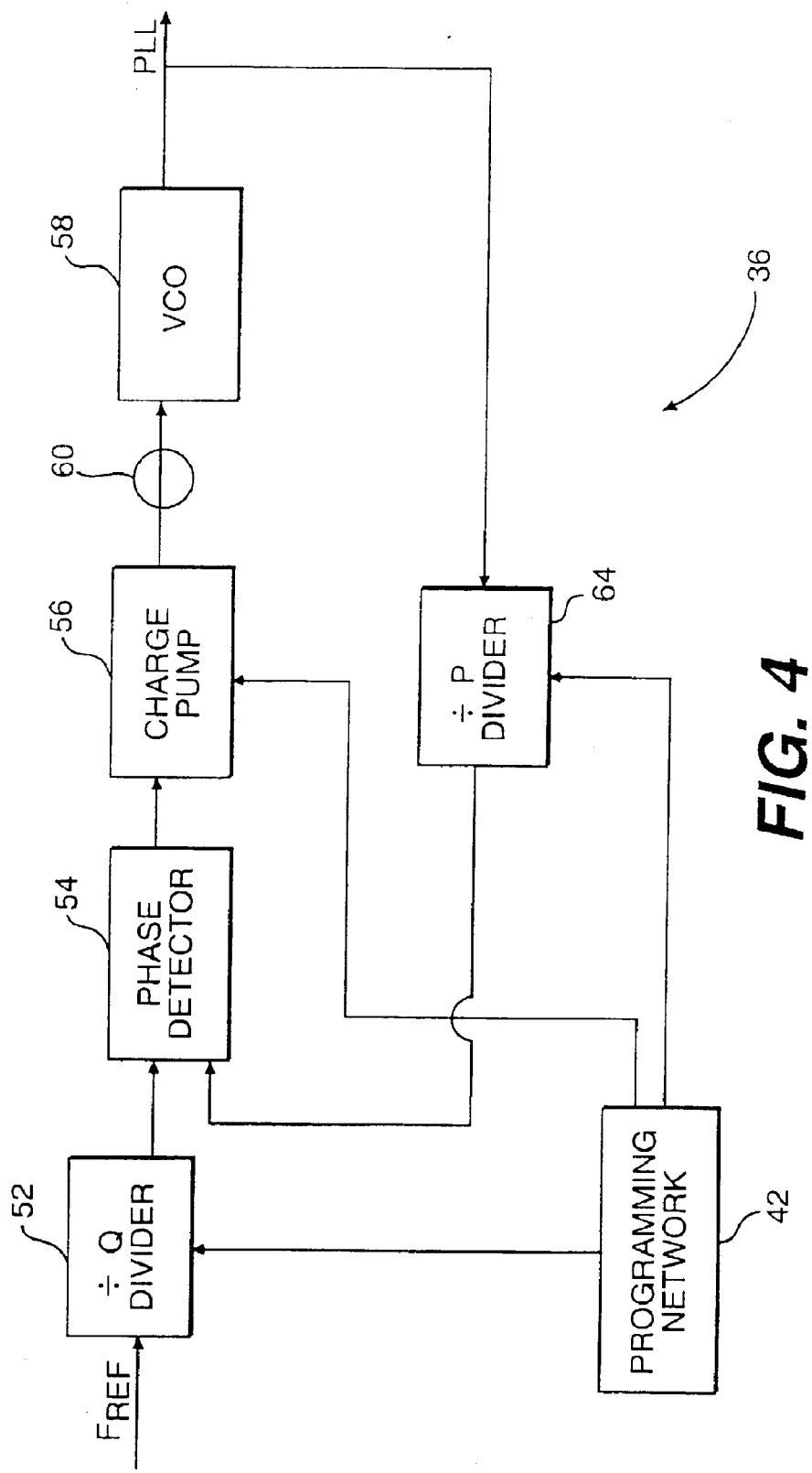
FIG. 4 is a schematic diagram of a phase locked loop circuit included in the programmable crystal oscillator of FIG. 2.

Still referring to FIG. 2, oscillator circuit 34 outputs the reference frequency $F_{ref}$, which is applied to a frequency multiplier 36, illustrated in greater detail in FIG. 4. The frequency multiplier outputs clock signals at a frequency $F_{pll}$ to a frequency divider 38, which divides the frequency $F_{pll}$ by a programmable parameter N, received from programming network 42, to produce clock signals $F_{out}$ of a programmed frequency conforming to customer specification. The $F_{out}$ and $F_{ref}$ signals are applied as separate inputs to a multiplexor 40. Under the control of program control logic in programming network 42, imposed over line 43, multiplexor 40 outputs either clock signals $F_{out}$ or $F_{ref}$ through an output buffer 44 and onto terminal 26.

In accordance with another feature of the present invention, crystal oscillator 20 further includes a pair of load circuits 46 and 48 that may be programmed, if necessary, to adjust the capacitive load on crystal 30 and, in turn, pull the crystal source frequency into a range of frequencies conducive to optimal programming of crystal oscillator 20 to achieve not only the output frequency accuracy specified by a customer, but also a low phase locked loop frequency conducive to stable operation of frequency multiplier 36.

Figure 3:
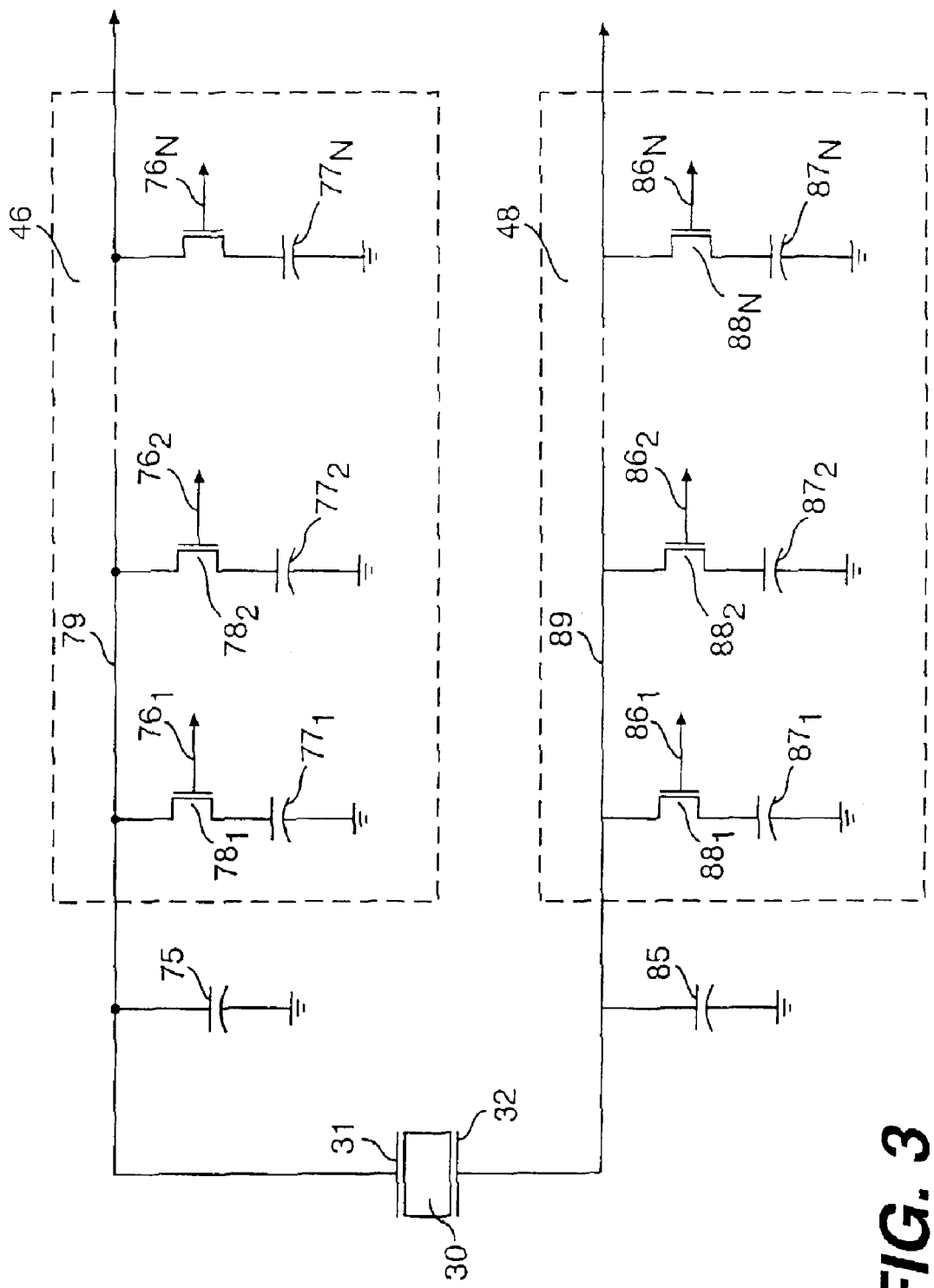
FIG. 3 is a detailed circuit schematic of a programmable capacitive load circuit included in the programmable crystal oscillator of FIG. 2.

Load circuits 46 and 48 are illustrated in greater detail in FIG. 3. Load circuits 46 and 48 can include, for example, pluralities of capacitors $77_1$ to $77_n$ and $87_1$ to $87_n$, respectively. Capacitors $77_1$ to $77_n$ are respectively connected between ground and source electrodes of first switching elements or transistors $78_1$ to $78_n$, and capacitors $87_1$ to $87_n$ are respectively connected between ground and source electrodes of second switching elements or transistors $88_1$ to $88_n$. As further shown in FIG. 3, the gate of each of transistors $78_1$ to $78_n$ is connected by a corresponding one of output leads $76_1$ to $76_n$ from programming network 42, indicated collectively at 76 in FIG. 2. The drain electrodes of these transistors are connected in common to a source frequency input line 79 connecting crystal pad 31 to oscillator circuit 34. In a similar fashion, the gate electrodes are respectively connected to output leads $86_1$ to $86_n$ from programming network 42, (collectively indicated at 86 in FIG. 2), and the drain electrodes of transistors $88_1$ to $88_n$ are connected in common to source frequency input line 89 connecting crystal pad 32 to oscillator circuit 34. Additionally, fixed capacitors 75 and 85 (each having a capacitance of, e.g., 35 pf) are provided as a nominal capacitance load for crystal blank 30.

In response to a parameter stored in memory network 42, selected output lines $76_1$ to $76_n$ and $86_1$ to $86_n$ are driven high to activate or turn-on corresponding ones of transistors $78_1$ to $78_n$ and $88_1$ to $88_n$. As a result, those of capacitors $77_1$ to $77_n$ and $87_1$ to $87_n$ associated with the activated transistors are coupled to one of source frequency input lines 79 and 89. Thus, the capacitive loading of crystal blank 30 can be set in accordance with the parameter stored in memory network 42, and the crystal source frequency can therefore be "pulled" into a desired range, leaving gross output frequency adjustment to be accomplished by multiplier circuit 36. If no crystal frequency pulling is necessary, none of transistors $78_1$ to $78_n$ and $88_1$ to $88_n$ is activated.

Each of capacitors $77_1$ to $77_n$ and $87_1$ to $87_n$ may have a capacitance of, for example, 5 pf. Moreover, capacitors $77_1$ to $77_n$ and $87_1$ to $87_n$ are symmetrically connected into source frequency input lines 79 and 89, respectively, such that for each one of capacitors $77_1$ to $77_n$ connected to source frequency input line 79, a corresponding one of capacitors $87_1$ to $87_n$ is connected to source frequency input line 89. Accordingly, pairs of capacitors $77_1$ to $77_n$ and $87_1$ to $87_n$ (one from each group of capacitors $77_1$ to $77_n$ and $87_1$ to $87_n$) are respectively connected to input lines 79 and 89, and the incremental change of capacitance associated with each pair of capacitors may be 2.5 pf. As noted previously, this capacitance loading adjustment is effective to pull the crystal source frequency up or down as required to adjust the reference clock signal frequency $F_{ref}$ to a value appropriate for optimal frequency programming of crystal oscillator 20.

As seen in FIG. 4, frequency multiplier 36 includes a frequency divider 52 that divides the, reference frequency $F_{ref}$ by a programmable parameter Q stored in programming network 42 and applies the resultant clock signal frequency to a phase detector 54 of a phase locked loop (PLL). The phase locked loop includes a charge pump 56, a loop filter 60, and a voltage controlled oscillator 58 that produces the clock signal frequency $F_{pll}$ going to frequency divider 38 in FIG. 2. This clock signal frequency $F_{pll}$ is also fed back through a frequency divider 64 to a second input of phase detector 54. Divider 64 divides the $F_{pll}$ frequency by a programmable parameter P also stored in programming network 42.

During operation, parameters Q and P, further defined below, are supplied to program divider circuits 52 and 64, respectively, from programming network 42. Reference frequency $F_{ref}$ is thus divided by the programmed parameter Q in divider circuit 52. As noted above, $F_{ref}$ corresponds to the source frequency of crystal 30, and is therefore typically in a range of 5.64 MHz to 27.3 MHz. If Q is an integer within a range of 132 to 639, the quotient $F_{ref}/Q$, i.e., the output of divider 52, can be made to fall within the range of 32 KHz to 50 KHz, regardless of the crystal source frequency. The quotient $F_{ref}/Q$ is the loop frequency of the phase locked loop circuit shown in FIG. 4.

The loop frequency is supplied to phase comparator 54, along with the output of divider 64, which outputs a control signal typically at a frequency substantially equal to the difference between the output frequencies of dividers 52 and 64. The control signal, in turn, is supplied to charge pump 56 which outputs a DC signal proportional to the frequency of the control signal. The loop filter 60 is provided at the output of charge pump 56 in order to define the response of the phase-locked loop circuit.

The DC signal is next supplied to voltage controlled oscillator (VCO) 58, which outputs clock signal $F_{pll}$ of a frequency controlled by the potential of the DC signal. Clock signal $F_{PLL}$ is next fed back to one of the inputs of phase detector 64 via P divider 64. Accordingly, with this phase locked loop arrangement, $F_{PLL}$ is equal to the product of the loop frequency multiplied by programmable P, an integer in the range of 2048 to 4097, so that $F_{PLL}$ is within the range of 87.5 MHz to 175 MHz. Clock signal $F_{PLL}$ is also supplied to divider circuit 38 (see FIG. 2), where it is divided by any programmed one of the following integer parameters retrieved from programing network 42: 1, 2, 4, 8, 16, 32, 64, 128 or 256, and then outputted as frequency $F_{out}$ through multiplexor 40 and output buffer 44.

Phase detector 54, charge pump 56, loop filter 60 and VCO 58 are intended to represent a broad category of circuits utilized to phase lock two input signals, which are well known in the art and will not be described further.

Generally, the output frequency $F_{PLL}$ and $F_{ref}$ satisfy the following equation:

$$F_{PLL}=F_{ref}(P/Q).$$

Thus, $F_{PLL}$ is a multiple of the loop frequency. Accordingly, for relatively low loop frequencies, $F_{PLL}$ can be finely adjusted in small increments of the loop frequency. If the loop frequency is too low, the phase locked loop can become unstable, resulting in jitter. Thus, it has been determined that an optimal loop frequency range is 32 KHz to 50 KHz, with a preferred range of 42.395 KHz to 43.059 KHz. Loop frequencies above this range, but less than 200 KHz, can also be used with output frequency resolution better than that obtainable by conventional crystal oscillator PLLs.

Conventional crystal oscillator phase locked loops used in digital circuit timing applications, however, operate at a significantly higher loop frequency, i.e., greater than 200 KHz. At these frequencies, such conventional crystal oscillators cannot achieve the same high frequency resolution attainable with the present invention. Typically, polysilicon capacitors, for example, and other low noise components, are incorporated into the phase-locked loop typically used in the present invention so that it can operate with a loop frequency within the preferred range of 42.395 KHz to 43.059 KHz with relatively little jitter.

As discussed in greater detail in applicants' related patent application, entitled WORLDWIDE MARKETING LOGISTICS NETWORK INCLUDING STRATEGICALLY LOCATED CENTERS FOR FREQUENCY PROGRAMMING CRYSTAL OSCILLATORS TO CUSTOMER SPECIFICATION, Ser. No. 08/795,980, filed concurrently herewith, the disclosure thereof being incorporated herein by reference, the P, Q, and N parameters alone may be insufficient to achieve an output frequency sufficiently close, e.g., within 100 parts per million (100 ppm) of a specified target frequency. In which case, the crystal source frequency is pulled, as discussed above, to bring the resulting output frequency into the acceptable accuracy range.

Thus, the programmable crystal oscillator in accordance with the present invention can be used to generate an output frequency based on a wide range of crystal source frequencies. The output frequency is obtained by adjusting the source frequency with a programmable capacitive load, and operating the phase-locked loop circuit at a relatively low loop frequency. As a result, for any crystal having a source frequency within the relatively wide range of, e.g., 5.6396 MHz to 27.3010 MHz, crystal oscillator output frequencies within 100 ppm or less of a specified target frequency can be achieved by simply storing appropriate P, Q, N and crystal pulling parameters in a PROM included in programming network 42. As pointed out in the cited copending application, crystal oscillators 20 may be manufactured as generic programmable crystal oscillators, without regard to customer-specified output frequencies and simply programmed in a matter of seconds to generate output frequencies in accordance with customer specifications. Consequently, there is no need to manufacture the crystals to a plurality of standard frequencies, thus simplifying, expediting, and cost-reducing the manufacturing process. Leadtimes from customer purchase order to product delivery may thus be dramatically reduced.

While the present invention has been described in the context of using a standard microprocessor-type crystal blank that oscillates in the range of 5.6396 MHz to 27.3010 MHz, as noted above, it will be understood that the present invention may be achieved using an industry standard watch crystal mass produced to oscillate at 32.768 KHz. In this case, the desired low phase-locked loop frequency may be achieved without the need for frequency divider 52 in frequency multiplier 36 of FIG. 4. Crystal blank 30 would then, in effect, be coupled in direct drive relation with the phase-locked loop circuit. Since watch crystals, by virtue of mass production, are significantly less expensive than microprocessor-type crystals, further economies in the production of programmable crystal oscillators in accordance with the present invention may be achieved.

It will be apparent to those skilled in the art that various modifications and variations can be made in the programmable crystal oscillator of the present invention and in construction of this programmable crystal oscillator without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A programmable phase lock loop and oscillator tuning circuit comprising:
   a crystal oscillator;
   a programmable circuit coupled to the crystal oscillator;
   a phase lock loop circuit coupled to the crystal oscillator; and
   a programmable read only memory operatively connected to the programmable circuit and the phase lock loop circuit,
   wherein the programmable read only memory stores a value used to selectively adjust the programmable circuit, a feedback value for the phase lock loop (P), and a reference value for the phase lock loop (Q), and wherein the programmable circuit and the phase lock loop circuit are adapted to modify a reference frequency output from the crystal oscillator for producing, after programming of the programmable read only memory, one fixed output frequency.

2. A programmable phase lock loop and oscillator tuning circuit comprising:

an oscillator circuit;

a programmable capacitor load circuit coupled to the oscillator circuit;

a phase lock loop circuit coupled to the oscillator circuit; and a programmable read only memory operatively connected to the programmable capacitor load circuit and the phase lock loop circuit, wherein the programmable read only memory stores a capacitor load value used to selectively adjust the capacitance of the capacitor load circuit, a feedback value for the phase lock loop (P), and a reference value for the phase lock loop (Q), and wherein the programmable capacitor load circuit and the phase lock loop circuit are adapted to modify a reference frequency for producing, after programming of the programmable read only memory, one fixed output frequency.

3. A programmable phase lock loop and oscillator tuning circuit in accordance with claim 2, wherein said programmable capacitor load circuit comprises:

a plurality of capacitors adapted to be selectively coupled to an input of said oscillator circuit.

4. A programmable phase lock loop and oscillator tuning circuit in accordance with claim 3, wherein said programmable capacitor load circuit further comprises one or more switching elements, each switching element adapted for selectively coupling a respective one of the plurality of capacitors to said input of said oscillator circuit.

5. A programmable phase lock loop and oscillator tuning circuit in accordance with claim 4, wherein said capacitor load value includes information to select one or more of said plurality of switching elements for connecting corresponding ones of said capacitors to said input of said oscillator circuit.

6. A programmable oscillator circuit, comprising:

a first input configured to receive programming data;

a programming circuit coupled to the first input and configured to store the programming data;

a programmable load circuit coupled to the programming circuit and allowing a connection to a crystal, capable of generating a source frequency;

a oscillator circuit coupled to the programmable load circuit and allowing a connection to the crystal, wherein the programmable load circuit and the oscillator circuit produce an adjusted source frequency from the source frequency based on the programming data;

a frequency multiplier circuit coupled to the oscillator circuit and the programming circuit and configured to produce an output frequency which is substantially equal to a product of the adjusted source frequency and a multiplication factor designated by the programming data, the frequency multiplier circuit comprising:

a phase locked loop circuit, a first divider for dividing the adjusted source frequency by a first parameter of the programming data to generate a first frequency, a second divider included in said phase locked loop circuit for dividing said output frequency by a second parameter of the programming data to generate a second frequency, and a detector included in said phase locked loop circuit and coupled to receive said first and second frequencies, said detector outputting a control signal in response to the first and second frequencies for controlling a generation of the output frequency, a frequency divider circuit coupled to the frequency multiplier circuit and the programming circuit and configured to divide the output frequency by a third parameter of the programming data;

a multiplexor circuit coupled to the frequency divider circuit, the oscillator circuit, and the programming circuit and configured to select either the output frequency or the adjusted source frequency; and a first output coupled to the multiplexor and the programming circuit and configured to output either the output frequency or the adjusted source frequency selected by the multiplexor circuit.

7. The programmable oscillator circuit in accordance with claim 6, wherein said programmable load circuit is a programmable capacitive load circuit.

8. The programmable oscillator circuit in accordance with claim 7, wherein the source frequency is supplied over a source frequency line to be coupled to the crystal, the programmable capacitive load circuit comprises:

a plurality of capacitors, selected ones of the plurality of capacitors being coupled to the source frequency line.

9. The programmable oscillator circuit in accordance with claim 8, wherein the programmable capacitive load circuit further comprises:

a plurality of switching elements, each of which having a first terminal connected in common to the source frequency line, and a second terminal coupled to a corresponding one of the plurality of capacitors.

10. The programmable oscillator circuit in accordance with claim 9, wherein the programming circuit generates a plurality of output signals in accordance with the programming data stored therein, the plurality of output signals being supplied to the programmable capacitive loading circuit to activate selected ones of the plurality of switching elements to connect corresponding ones of the capacitors to the source frequency line.

11. The programmable oscillator circuit in accordance with claim 9, wherein each of the plurality of switching elements comprises an MOS transistor.

12. The programmable oscillator circuit in accordance with claim 6, wherein the detector outputs the control signal in accordance with a phase difference between the first and second frequencies, the phase locked loop circuit further comprising:

a charge pump circuit receiving said control signal and outputting a DC signal in response thereto;

a loop filter; and a voltage controlled oscillator coupled to said charge pump through said loop filter, said voltage controlled oscillator generating said output frequency under a control of said DC signal.

13. The programmable oscillator circuit in accordance with claim 12, further comprising:

a first PROM for storing signature data;

a program terminal for programming the first PROM with the signature data; and a second output for outputting the signature data out of the first PROM.

14. The programmable oscillator circuit in accordance with claim 13, further including a second input for receiving clock signals to read the signature data from the first PROM out onto the second output.

* * * * *